US010996351B2

(12) United States Patent
Steadman Booker et al.

(10) Patent No.: US 10,996,351 B2
(45) Date of Patent: May 4, 2021

(54) PULSE SHAPER

(71) Applicant: KONINKLIJKE PHILIPS N.V., Eindhoven (NL)

(72) Inventors: Roger Steadman Booker, Aachen (DE); Christoph Herrmann, Aachen (DE)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 31 days.

(21) Appl. No.: 16/500,231

(22) PCT Filed: Apr. 4, 2018

(86) PCT No.: PCT/EP2018/058519
§ 371 (c)(1),
(2) Date: Oct. 2, 2019

(87) PCT Pub. No.: WO2018/185118
PCT Pub. Date: Oct. 11, 2018

(65) Prior Publication Data
US 2020/0064500 A1    Feb. 27, 2020

(30) Foreign Application Priority Data
Apr. 6, 2017    (EP) .................................... 17165169

(51) Int. Cl.
*G01T 1/24*    (2006.01)
*H03K 5/1532*    (2006.01)
(52) U.S. Cl.
CPC ........... *G01T 1/247* (2013.01); *H03K 5/1532* (2013.01)
(58) Field of Classification Search
CPC ........ G01T 1/247; H03K 5/1532; H03K 5/06; H03K 2005/00065
See application file for complete search history.

(56) References Cited

U.S. PATENT DOCUMENTS 9,343,212 B2    5/2016 Shinohara
9,664,797 B2    5/2017 Roessl
(Continued)

FOREIGN PATENT DOCUMENTS

EP    2176684 B1    4/2015
WO    WO2008155680 A2    12/2008
(Continued)

OTHER PUBLICATIONS

PCT International Search Report, International application No. PCT/EP2018/058519, dated August 31, 2018.
(Continued)

*Primary Examiner* — Chih-Cheng Kao
(74) *Attorney, Agent, or Firm* — Larry Liberchuk

(57) ABSTRACT

The invention relates to a pulse shaper (18). The pulse shaper (18) comprises an integrator (19) for generating a pulse having a peak amplitude indicative of the energy of a detected photon, a feedback resistor (22), switchable discharge circuitry (23) for discharging the integrator (19), and a peak detector (24) for detecting the peak of the pulse. The pulse shaper is adapted to start the discharge of the integrator by the switchable discharge circuitry based on the detection of the peak and to connect the feedback resistor in parallel to the integrator during a period of the pulse generation and to disconnect the feedback resistor during another period of the pulse generation. The pulse shaper can be such that the generation of the pulse is substantially unhindered by any noticeable concurrent discharging mechanism while, at the same time, the occurrence of energy pedestals can be efficiently avoided.

15 Claims, 7 Drawing Sheets

(56) References Cited

U.S. PATENT DOCUMENTS

| | | | |
|---|---|---|---|
| 2001/0045856 A1 | 11/2001 | Ooishi | |
| 2007/0158551 A1* | 7/2007 | Audebert | G01T 1/17 250/306 |
| 2010/0025589 A1 | 2/2010 | Olcott | |
| 2010/0187432 A1* | 7/2010 | Herrmann | G01T 1/171 250/395 |
| 2010/0207027 A1* | 8/2010 | Marks | G01T 1/171 250/336.1 |
| 2015/0061735 A1 | 3/2015 | Lee | |

FOREIGN PATENT DOCUMENTS

| | | |
|---|---|---|
| WO | WO2009050619 A2 | 4/2009 |
| WO | WO2014002022 A2 | 1/2014 |

OTHER PUBLICATIONS

Schlomka J. P. et al., "Experimental Feasibility of Multi-Energy Photon-Counting K-Edge Imaging in Pre-Clinical Computed Tomography", Physics in Medicine and Biology, vol. 53, No. 15 (2008).
Steadman Booker R. et al., "ChromAIX: Fast Photon-Counting ASIC for Spectral Computed Tomography", Nuclear Instruments and Methods in Physics Research Section A: Accelerators, Spectrometers, Detectors and Associated Equipment, vol. 648, Suppl. 1, Aug. 21, 2011, pp. S211-S215.

* cited by examiner

PULSE SHAPER

FIELD OF THE INVENTION

The invention relates to a pulse shaper, a spectral photon counting detector comprising the pulse shaper, an x-ray imaging system comprising the spectral photon counting detector, and a pulse shaping method.

BACKGROUND OF THE INVENTION

Radiation detectors used for imaging applications like spectrally resolving computed tomography (CT) make use of a direct conversion material, such as cadmium telluride (CdTe), cadmium zinc telluride (CdZnTe) or silicon (Si), that is disposed between a cathode and an anode, with a voltage applied across the cathode and the anode. X-ray photons that illuminate the cathode transfer energy to electrons in the direct conversion material, which creates electron/hole pairs with the electrons drifting towards the anode. The anode, in response, produces an electrical signal that is further processed in order to measure photon counts in one or more energy bins. This may be done by a pre-amplifier, such as a charge-sensitive amplifier (CSA), which amplifies the electrical signal, a pulse shaper based, for instance, on a combination of an operational amplifier and a feedback capacitor, which processes the amplified electrical signal and generates a pulse having a peak amplitude or height that is indicative of the energy of a detected photon, an energy discriminator which compares the height of the pulse with one or more energy thresholds, a photon counter which counts for each energy threshold the number of times the leading edge of a pulse crosses the threshold, and an energy binner which bins the photon counts into energy ranges, thereby spectrally resolving the detected radiation. The energy binner can, in principle, be implemented in hardware; more typically, however, it is realized by an external software component that reads-in the photon counts from the photon counter.

One of the requirements of spectrally resolving computed tomography is that the detector must be capable of resolving a very high impinging x-ray photon flux. To meet this challenge, the pulse shaper usually operates with ballistic deficit, i.e., the actually achieved pulse height is smaller than the height corresponding to the total collected charge. This poses significant implementation challenges in terms of signal-to-noise ratio (SNR) and signal homogeneity across a number of channels.

To simultaneously address the SNR issues and adequately address the count-rate requirements it is necessary to ensure that the complete charge collection has taken place before allowing the feedback capacitor to discharge. In this way, no ballistic deficit may occur. Topologies are known to offer such a behavior, but a trade-off with the count rate capability is required. For this reason, reset schemes (the feedback capacitor of the pulse shaper is reset after the charge has been collected) have been proposed too. For example, WO 2008/155680 A2 discloses a scheme in which a peak detector detects the peak of the pulse, wherein upon detection of the peak a reset switch that is connected in parallel to the feedback capacitor is closed in order to shorten and discharge the feedback capacitor. This approach allows improving SNR while still offering sufficient count rate performance. However, there is still a need for further improvements with regards to the design and control of the pulse shaper.

WO 2009/050619 A2 discloses a particle-counting apparatus, which reduces a resulting width of pulses when a charge pulse is received from a particle detector. Pulse shortening is obtained by resetting the pulse shortly after it exceeds its peak level at the apparatus output. The apparatus includes a charge-sensitive amplifier and a shaper which generates an output for subsequent discrimination circuits. A reset generator monitors the shaper output and generates a reset signal to the shaper when a peak has been detected.

WO 2008/155680 A2 discloses an apparatus including an integrator that produces a pulse having a peak amplitude indicative of the energy of a detected photon. First discharging circuitry discharges the integrator at a first discharging speed, and second discharging circuitry discharges the integrator at a second discharging speed. The first discharging speed is less than the second discharging speed.

SUMMARY OF THE INVENTION

It is an object of the invention to provide a pulse shaper and a pulse shaping method, which make use of an improved design and/or control. It is a further object of the invention to provide a spectral photon counting detector comprising the pulse shaper, and an x-ray imaging system comprising the spectral photon counting detector.

In a first aspect of the present invention, a pulse shaper for use in a spectral photon counting detector is presented, wherein the pulse shaper comprises:

an integrator for generating a pulse having a peak amplitude indicative of the energy of a detected photon;

a feedback resistor;

switchable discharge circuitry for discharging the integrator; and a peak detector for detecting the peak of the pulse, wherein the pulse shaper is adapted to start the discharge of the integrator by the switchable discharge circuitry based on the detection of the peak and to connect the feedback resistor in parallel to the integrator during a period of the pulse generation and to disconnect the feedback resistor during another period of the pulse generation, wherein the switchable discharge circuitry comprises at least one current source, wherein the pulse shaper is adapted to connect the at least one current source in parallel to the integrator to discharge the integrator and to disconnect the feedback resistor from the integrator during the discharge.

Since the pulse shaper comprises a feedback resistor that is connected in parallel to the integrator during a period of the pulse generation and disconnected during another period of the pulse generation, it is possible to design the pulse shaper such that the generation of the pulse is substantially unhindered by any noticeable concurrent discharging mechanism while, at the same time, the occurrence of energy pedestals, i.e., energy offsets of any subsequent pulse caused by an insufficient discharge can be efficiently avoided. Outside the pulse generation phase, the feedback resistor is preferably continuously connected in parallel to the integrator in order to remove any remaining energy pedestals. Moreover, by employing at least one current source for discharging the integrator, a "soft reset" of the integrator can be realized. Moreover, since the feedback resistor is disconnected during the discharge, the integrator can be discharged with a constant current resulting in a linear discharge. In addition, any charge resulting from photons detected during the discharge will not be lost but will still contribute to the pulse, i.e., the output of the integrator will react to them. This may help in pile-up correction since it may facilitate the pile-up model to account for the event that pulses overlap during the trailing edge of the pulses.

As will be described in more detail below, the spectral photon counting detector comprises detection elements for detecting polyenergetic x-ray radiation, wherein each detection element comprises the pulse shaper, an energy discriminator for comparing the peak amplitude to one or more energy thresholds, and a photon counter for counting for each energy threshold the number of times the leading edge of a pulse crosses the energy threshold.

It is preferred that the at least one current source comprises two or more current sources, wherein the number of the current sources that are connected depends on a number of predefined thresholds associated with the two or more current sources that are crossed by the leading edge of the pulse. The predefined thresholds preferentially correspond to the energy thresholds employed by the energy discriminator, i.e., if the leading edge of the pulse only crosses the lowest energy threshold, only one current source is connected in parallel to the integrator to discharge the integrator, if the leading edge of the pulse crosses both the lowest and the second lowest energy threshold, two current sources are connected in parallel to the integrator to discharge the integrator, and so on. If the leading edge of the pulse crosses all energy thresholds, all current sources are connected in parallel to the integrator to discharge the integrator.

Preferentially, the pulse shaper is adapted to gradually reduce the number of connected current sources during the discharge. To this end, the pulse shaper is preferably adapted to disconnect a current source when the trailing edge of the pulse crosses a predefined threshold, such as the corresponding energy threshold, associated with the current source. For instance, let us assume that the leading edge of the pulse has crossed all energy thresholds such that all current sources are initially connected in parallel to the integrator to discharge the integrator. Now, during the discharge, the trailing edge of the pulse successively crosses the highest energy threshold and any lower energy thresholds up to the lowest energy threshold, wherein, in each case, the current source to which the respective energy threshold is associated is disconnected. As with the at least one current source, the discharge can preferably be performed by each current source with a constant current resulting in a piece-wise linear discharge, wherein the respective slope depends on the number of connected current sources. In this manner, the discharge of the integrator can be made faster while the pulse is higher and slowed-down as the pulse becomes lower. The benefit of such a topology is the deterministic slope between thresholds, which may further facilitate pile-up modeling. Furthermore, a "soft" transition as realized by the interaction of the current sources may help in minimizing spurious transients caused by a limited slew-rate of electronic components of the integrator.

It is preferred that the pulse shaper is adapted to stop the discharge by the switchable discharge circuitry when the trailing edge of the pulse crosses a predefined threshold. In particular, it is preferred that the predefined threshold is selected from (i) the lowest energy threshold of the energy discriminator, (ii) an additional threshold between the lowest energy threshold of the energy discriminator and a baseline of the peak, and (iii) the baseline of the peak. In the first case, if the trailing edge of the pulse crosses the lowest energy threshold, the pulse shaper disconnects the at least one or last current source and reconnects the feedback resistor in parallel to the integrator. The remaining discharge then occurs according to the time constant of the integrator and the feedback resistor. This is straight-forward, since the lowest threshold of the energy discriminator may be readily available. However, it may imply that a relatively large charge is still stored in the integrator which can only be discharged by the feedback resistor. Since the feedback resistor must be relatively large in order to minimize the ballistic deficit, this may result in a comparably long discharge time. In contrast, when an additional threshold (not used for energy binning) is used, which preferably is as close as possible to the baseline of the pulse, the remaining charge can be small compared to the equivalent energy of the lowest threshold of the energy discriminator. This may allow for the generation of shorter pulses and, thus, for a higher count rate. Finally, if the baseline of the peak is used as the predefined threshold, the integrator will be fully discharged by the switchable discharge circuitry. However, this might cause overshoots due to the finite reaction time between detecting the zero-crossing and releasing the reset.

It is also preferred that the pulse shaper further comprises a valley detector for detecting a valley between two pulses, wherein the pulse shaper is adapted to stop the discharge by the switchable discharge circuitry based on the detection of the valley. The valley detector may allow to timely stop the discharge by the switchable discharge circuitry in the event of a detection of a pulse overlapped to the discharge of a preceding pulse. In that event it would be important to stop the discharge and to allow collecting the charge of the new event. In the absence of pile-up, however, the peak detector would need to be combined with one of the described threshold-based mechanisms for stopping the discharge by the switchable discharge circuitry to ensure that the discharge is also stopped in such conditions It is preferred that the pulse shaper further comprises a pre-amplifier for amplifying an electrical signal that depends on the energy of the detected photon, wherein the amplifier is arranged upstream to the integrator and the pulse shaper is adapted to perform the detection of the peak and the control of the discharge by the switchable discharge circuitry based on the amplified electrical signal.

In another aspect of the present invention, a pulse shaper for use in a spectral photon counting detector is presented, wherein the pulse shaper comprises:

an integrator for generating a pulse having a peak amplitude indicative of the energy of a detected photon;

a feedback resistor;

switchable discharge circuitry for discharging the integrator; and a peak detector for detecting the peak of the pulse, wherein the pulse shaper is adapted to start the discharge of the integrator by the switchable discharge circuitry based on the detection of the peak and to connect the feedback resistor in parallel to the integrator during a period of the pulse generation and to disconnect the feedback resistor during another period of the pulse generation, wherein the pulse shaper further comprises a charging phase start detector for detecting the start of a charging phase of the integrator, wherein the switchable discharge circuitry comprises the feedback resistor, wherein the pulse shaper is adapted to disconnect the feedback resistor from the integrator between the detected start and the detection of the peak and to connect the feedback resistor to discharge the integrator.

This aims at minimizing both the ballistic deficit and a potential (partial) charge loss outside the discharge phase. The feedback resistor is disconnected from the integrator during the charging phase (charge collection phase) and reconnected again when the peak of the pulse is detected by the peak detector, i.e., when all the charge resulting from the detection of a single photon has been collected.

Preferentially, since the feedback resistor is connected to the integrator before the start of the charging phase is detected, any low-energy events which stay undetected by the charging phase start detector, such that the feedback resistor is not disconnected, then see a "continuous reset"—this term is used in the literature for the concept of a feedback resistor connected permanently in parallel to the feedback capacitor—as implemented by the feedback resistor, i.e., the pulse shaper generates a small pulse which is, however, not detected (since its amplitude is not sufficient to trigger the charging phase start detector), and the problem of a remaining energy pedestal is eliminated.

The feedback resistor is preferably dimensioned to be relatively small in order to discharge the integrator fast enough to support high count rates. While a small feedback resistor causes a high ballistic deficit in a traditional implementation of the "continuous reset", this is no issue here due to the disconnecting the feedback resistor during the charging phase (charge collection phase).

It is preferred that the charging phase start detector is adapted to detect the start by detecting a fast change of the amplitude of the pulse. This takes account of the fact that the amplitude of the pulse is expected to change quickly at the start of the charging phase.

It is also preferred that the pulse shaper further comprises an additional feedback resistor that is permanently connected in parallel to the integrator. In particular, if the additional feedback resistor is quite large, this can simplify the detection of the peak of the pulse. This larger feedback resistor makes sure that a real peak is formed, which can be detected more easily by the peak detector.

In another aspect of the present invention, a spectral photon counting detector is presented, wherein the spectral photon counting detector comprises:

detection elements for detecting polyenergetic x-ray radiation, wherein each detection element comprises:

a pulse shaper as defined in claim 1 or 9;

an energy discriminator for comparing the peak amplitude to one or more energy thresholds; and a photon counter for counting for each energy threshold the number of times the leading edge of a pulse crosses the energy threshold.

In another aspect of the present invention, an x-ray imaging system is presented, wherein the x-ray imaging system comprises:

an x-ray radiation device for providing polyenergetic x-ray radiation for traversing an examination zone adapted to accommodate an object;

a spectral photon counting detector as defined in claim 12; and a reconstruction unit for reconstructing an image based on the photon counts.

In another aspect of the present invention, a pulse shaping method for use in a spectral photon counting detector is presented, wherein the pulse shaping method comprises:

generating a pulse having a peak amplitude indicative of the energy of a detected photon, by an integrator;

detecting the peak of the pulse, by a peak detector;

starting the discharge of the integrator by a switchable discharge circuitry based on the detection of the peak; and connect a feedback resistor in parallel to the integrator during a period of the pulse generation and disconnect the feedback resistor during another period of the pulse generation, wherein the switchable discharge circuitry comprises at least one current source, wherein the pulse shaping method connects the at least one current source in parallel to the integrator to discharge the integrator and disconnects the feedback resistor from the integrator during the discharge.

In another aspect of the present invention, an x-ray imaging system is presented, wherein the x-ray imaging system comprises:

an x-ray radiation device for providing polyenergetic x-ray radiation for traversing an examination zone adapted to accommodate an object;

a spectral photon counting detector as defined in claim 12; and a reconstruction unit for reconstructing an image based on the photon counts.

In another aspect of the present invention, a pulse shaping method for use in a spectral photon counting detector is presented, wherein the pulse shaping method comprises:

generating a pulse having a peak amplitude indicative of the energy of a detected photon, by an integrator;

detecting the peak of the pulse, by a peak detector;

starting the discharge of the integrator by a switchable discharge circuitry based on the detection of the peak; and connect a feedback resistor in parallel to the integrator during a period of the pulse generation and disconnect the feedback resistor during another period of the pulse generation, wherein the pulse shaping method further comprises detecting the start of a charging phase of the integrator, by a charging phase start detector, wherein the switchable discharge circuitry comprises the feedback resistor, wherein the pulse shaping method disconnects the feedback resistor from the integrator between the detected start and the detection of the peak and connects the feedback resistor to discharge the integrator.

It shall be understood that the pulse shapers of claims 1 and 9, the spectral photon counting detector of claim 12, and the x-ray imaging system of claim 13, and the pulse shaping methods of claims 14 and 15 have similar and/or identical preferred embodiments, in particular, as defined in the dependent claims.

It shall be understood that a preferred embodiment of the present invention can also be any combination of the dependent claims or above embodiments with the respective independent claim.

These and other aspects of the invention will be apparent from and elucidated with reference to the embodiments described hereinafter.

DETAILED DESCRIPTION OF EMBODIMENTS

Figure 1:
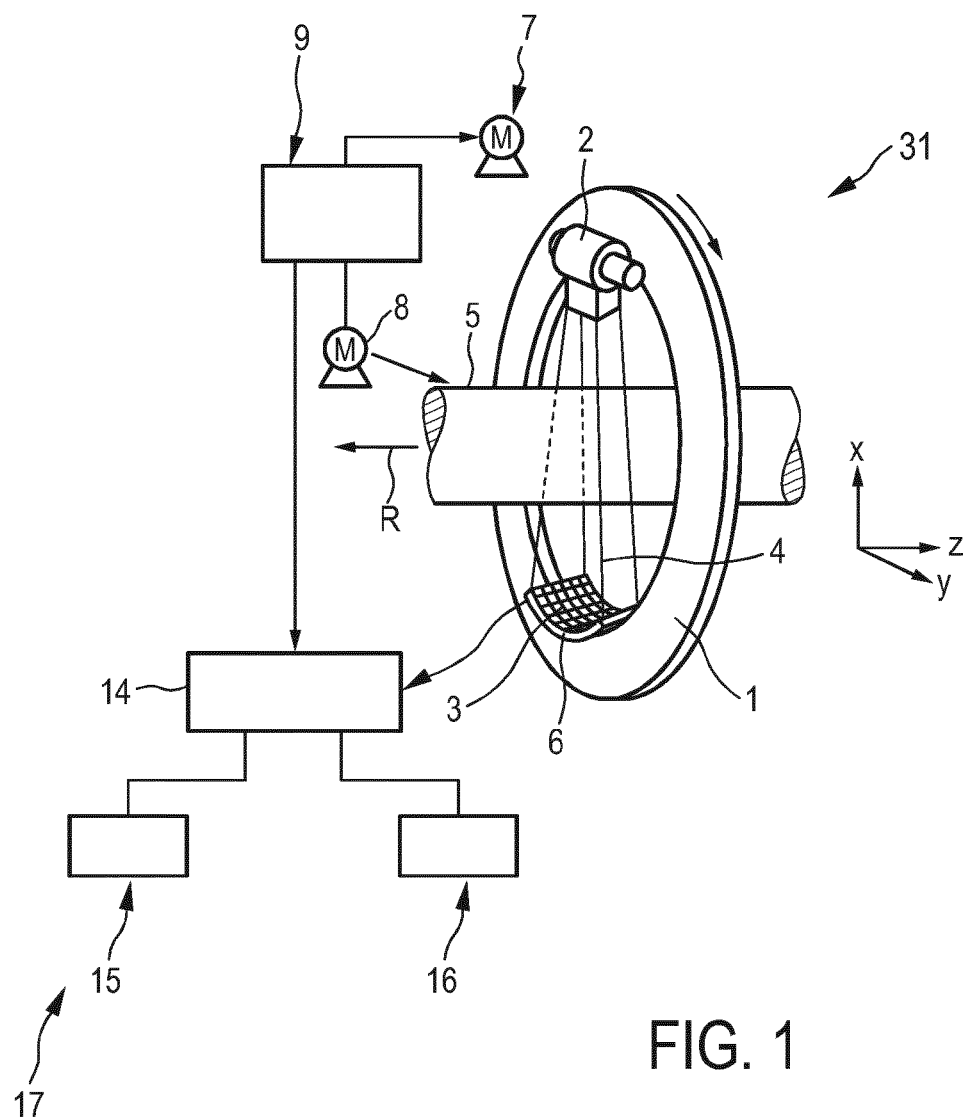
FIG. 1 shows schematically and exemplarily an embodiment of a x-ray imaging system.

FIG. 1 shows schematically and exemplarily an embodiment of an x-ray imaging system, here, a spectrally resolving computed tomography system for generating an image of an object. The spectrally resolving computed tomography system 17 includes a support 1 which is capable of rotating about a rotational axis R which extends parallel to the z direction. An x-ray radiation device 2, which comprises an x-ray tube and which is adapted to provide polyenergetic x-ray radiation 4 for traversing an examination zone 5 of the spectrally resolving computed tomography system 17 during a scan, is mounted on the support 1. In this embodiment, the x-ray radiation device 2 is adapted to provide a conical x-ray radiation beam 4 as the polyenergetic x-ray radiation. In another embodiment, the x-ray radiation device 2 can be adapted to provide the polyenergetic x-ray radiation with another beam shape, for instance, with a fan beam shape. The x-ray radiation 4 traverses an object (not shown), such as a patient, that is accommodated in the examination zone 5, which is cylindrical in this embodiment. After having traversed the examination zone 5, the x-ray radiation beam 4 is incident on a spectral photon counting detector 6, which comprises detection elements 3 arranged, here, in a two-dimensional detection surface. The spectral photon counting detector 6 is mounted on the support 1.

The spectrally resolving computed tomography system 17 comprises two motors 7, 8. The support 1 is driven at a preferably constant but adjustable angular speed by the motor 7. The motor 8 is provided for displacing the object, for example, a patient, who is arranged on a table (not shown) in the examination zone 5, parallel to the direction of the rotational axis R or the z-axis. The motors 7, 8 are controlled by a control unit 9, for instance, such that the x-ray radiation device 2 and the object within the examination zone 5 move relatively to each other along a helical trajectory. However, it is also possible that the object within the examination zone 5 is not moved, but that only the x-ray radiation device 2 is rotated, i.e., that the x-ray radiation device 2 moves along a circular trajectory relative to the object.

During the movement of the x-ray radiation device 2 relative to the object, the detection elements 3 of the spectral photon counting detector 6 detect the polyenergetic x-ray radiation after having traversed the examination zone 5 and the spectral photon counting detector 6 measures for each detection element 3 photon counts in one or more energy bins. Therefore, the x-ray radiation device 2, the elements for moving the x-ray radiation device 2 relative to the object, in particular, the motors 7, 8 and the support 1, and the spectral photon counting detector 6 can be regarded as being components of a spectral photon counting x-ray radiation detection system 31.

The spectrally resolving computed tomography system 17, in particular, the spectral photon counting x-ray radiation detection system 31, further comprises a reconstruction unit 14 for reconstructing a computed tomography image based on the photon counts by using known reconstruction algorithms. The reconstruction may be based on, for instance, a filtered back projection technique, an iterative reconstruction technique, a Radon inversion technique, et cetera. The photon counts constitute spectrally resolved projection data and the reconstruction may include a decomposition of the spectrally resolved projection data into different components, which may be related to different materials of the object within the examination zone 5 and/or to different physical effects, and a generation of one or more computed tomography images based on the decomposed spectrally resolved projection data. For instance, a computed tomography image may be reconstructed which is indicative of a single decomposed component only or of several of the decomposed components. The reconstructed computed tomography image may be shown on a display 16. For decomposing the spectrally resolved projection data into different components, known decomposition algorithms can be used like the algorithm disclosed in J. P. Schlomka et al., "Experimental feasibility of multi-energy photon-counting K-edge imaging in pre-clinical computed tomography", Physics in Medicine and Biology, Vol. 53, No. 15 (2008), the contents of which are herein incorporated by reference in their entirety. Additionally or alternatively, an image-based material decomposition may also be applied.

The spectrally resolving computed tomography system 17 further comprises an input unit 15, such as a computer mouse, a keyboard, a touchpad, et cetera, in order to allow a user to, for instance, input commands like start or stop commands and/or set parameters like acquisition and reconstruction parameters. The control unit 9 may also control the spectral photon counting detector 6 and/or the reconstruction unit 14.

The spectral photon counting detector 6 preferentially comprises detection elements 3 that make use of a direct conversion material, such as CdTe, CaZnTe or Si. Such a spectral photon counting detector is known, for instance, from R. Steadman et al., "ChromAIX: Fast photon-counting ASIC for Spectral Computed Tomography", Nuclear Instruments and Methods in Physics Research Section A: Accelerators, Spectrometers, Detectors and Associated Equipment, Vol. 648, Suppl. 1 (2011), the contents of which are herein incorporated by reference in their entirety.

Figure 2:
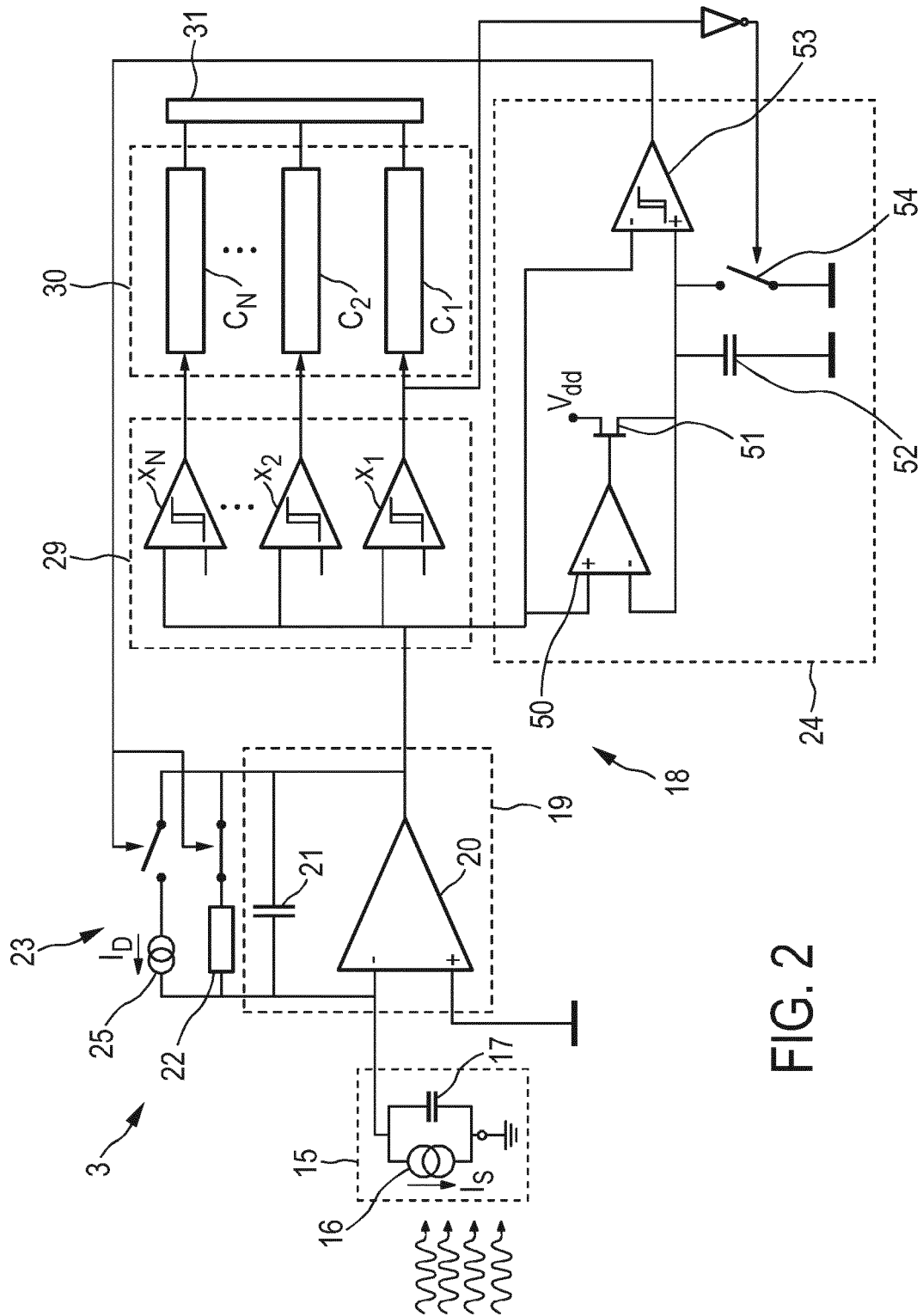
FIG. 2 shows schematically and exemplarily an embodiment of a detection element of the spectral photon counting detector shown in FIG. 1.

FIG. 2 shows schematically and exemplarily an embodiment of a detection element 3 of the spectral photon counting detector 6 shown in FIG. 1. The detection element 3 comprises a radiation sensitive sensor 15, which is represented here as a current source 16 with a current Is to which is connected in parallel a capacitance 17. The detection element 3 further comprises a pulse shaper 18, an energy discriminator 29, a photon counter 30 and a read-out 31. The pulse shaper 18 comprises an integrator 19, here, comprising an operational amplifier 20 and a feedback capacitor 21 that is connected in parallel to the operational amplifier 20, for generating a pulse having a peak amplitude indicative of the energy of a detected photon. The energy discriminator 29 is then adapted to compare the peak amplitude to one or more energy thresholds $X_1, X_2, \ldots, X_N$ and the photon counter 30 is adapted to count for each energy threshold the number of times $C_1, C_2, \ldots, C_N$ the leading edge of a pulse crosses the energy threshold. The pulse shaper 18 further comprises a feedback resistor 22, switchable discharge circuitry 23 for discharging the integrator 19 and a peak detector 24 for detecting the peak of the pulse generated by the integrator 19. The pulse shaper 18 is adapted to start the discharge of the integrator 19 by the switchable discharge circuitry 23 based on the detection of the peak.

In this example, the peak detector 24 comprises an operational amplifier 50, a transistor 51, a capacitor 52, a comparator 53 and a switch 54. The operational amplifier 50 is connected with its positive input to the output of the integrator 19, with its inverting input to the capacitor 52 and with its output to the gate of the transistor 51. The peak detector 24 works as follows: Let us assume that the capacitor 52 is completely discharged. As long as the positive input of the operational amplifier 50 is more positive than its inverting input, the capacitor 52 will be charged in dependence of the output of the integrator 19. That is, as long as the output of the integrator 19 is more positive that the voltage across the capacitor 52, the capacitor 52 will follow the output of the integrator 19. Now, if the output of the integrator 19 starts to decrease (indicative of a local maximum), the capacitor 52 keeps its charge. In that instant, the comparator 53 will trip since the voltage across the capacitor 52 is now higher than the output of the integrator 19. The comparator 53 then actuates the switches of the switchable discharge circuitry 23. In this respect, it is noted that the switchable discharge circuitry 23 is kept activated because the output voltage of the integrator 19 is by definition lower than the voltage drop across the capacitor 52. A mechanism is therefore required to short the capacitor 52 and thereby stop the discharge of the integrator 19 by the switchable discharge circuitry 23. This mechanism is provided by the switch 53.

In this embodiment, the switchable discharge circuitry 23 comprises at least one, here, exactly one, current source 25, wherein the pulse shaper 18 is adapted to connect the one current source 25 in parallel to the integrator 19 to discharge the integrator 19 and to disconnect the feedback resistor 22 from the integrator 19 during the discharge. To this end, corresponding switches are foreseen in the paths of the feedback resistor 22 and the one current source 25. The two switches can be driven by a same signal, wherein when one of the switches is closed the other switch is opened and vice versa. By employing a current source 25 for discharging the integrator 19, a "soft reset" of the feedback capacitor can be realized. Moreover, since the feedback resistor 22 is disconnected during the discharge, the integrator 19 can be discharged with a constant current resulting in a linear discharge. In addition, any charge resulting from x-ray photons impinging on the radiation sensitive sensor 15 during the discharge will not be lost but will still contribute to the pulse, i.e., the output of the integrator 19 will react to them. This may help in pile-up correction since it may facilitate the pile-up model to account for the event that pulses overlap during the trailing edge of the pulses.

In this embodiment, the pulse shaper 18 is adapted to stop the discharge of the integrator 19 by the switchable discharge circuitry 23 when the trailing edge of the pulse crosses a predefined threshold. Here, the predefined threshold corresponds to the lowest energy threshold $X_1$ of the energy discriminator 29, i.e., if the trailing edge of the pulse crosses the lowest energy threshold $X_1$, the pulse shaper 18 disconnects the one current source 25 and reconnects the feedback resistor 22 in parallel to the integrator 19. The remaining discharge then occurs according to the RC time constant of the feedback capacitor 21 and the feedback resistor 22.

Figure 3:
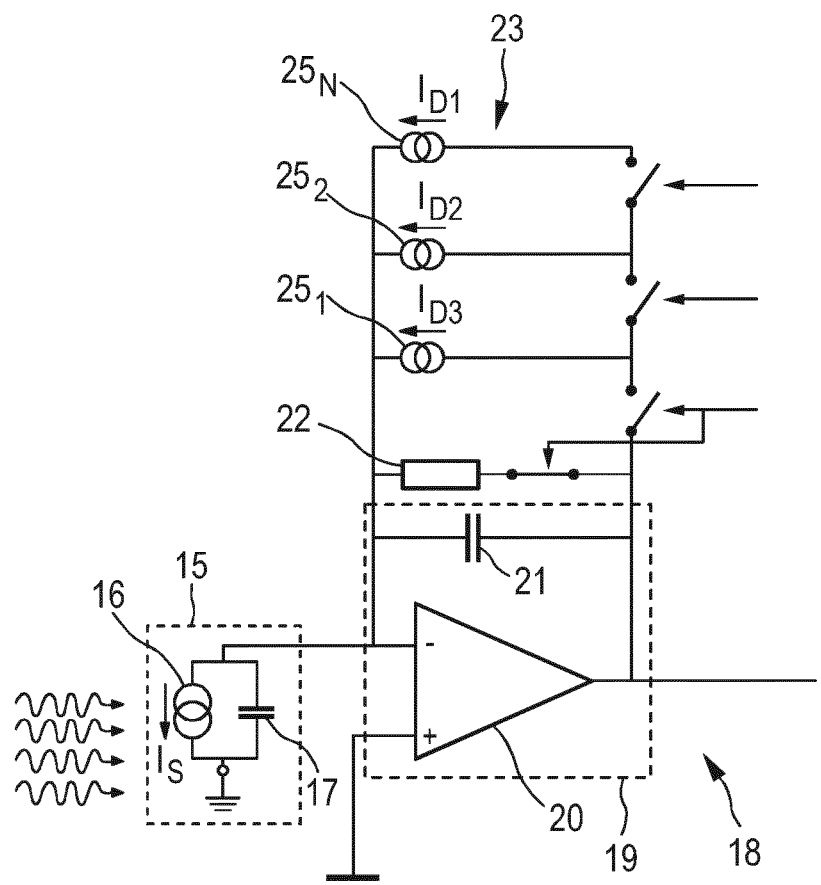
FIG. 3 shows schematically and exemplarily an extension of the embodiment of the detection element shown in FIG. 2.

FIG. 3 shows schematically and exemplarily an extension of the embodiment of the detection element 3 shown in FIG. 2. In the figure, the right part of FIG. 2, which shows the peak detector 24, the energy discriminator 29, the photon counter 30 and the read-out 31, has been omitted. In this extension, the at least one current source comprises two or more, here, N, current sources $25_1$, $25_2$, ..., $25_N$, wherein the number of the current sources $25_1$, $25_2$, ..., $25_N$ that are connected depends on a number of predefined thresholds associated with the N current sources $25_1$, $25_2$, ..., $25_N$) that are crossed by the leading edge of the pulse. Here, the predefined thresholds correspond to the energy thresholds $X_1$, $X_2$, ..., $X_N$ of the energy discriminator 29, i.e., if the leading edge of the pulse only crosses the lowest energy threshold $X_1$, only the one current source $25_1$ is connected in parallel to the integrator 19 to discharge the integrator 19, if the leading edge of the pulse crosses both the lowest and the second lowest energy threshold $X_1$, $X_2$, the two current sources $25_1$, $25_2$ are connected in parallel to the integrator 19 to discharge the integrator 19, and so on. If the leading edge of the pulse crosses all energy thresholds $X_1$, $X_2$, ..., $X_N$, all current sources $25_1$, $25_2$, ..., $25_N$ are connected in parallel to the integrator 19 to discharge the integrator 19.

In this embodiment, the pulse shaper 18 is adapted to gradually reduce the number of connected current sources $25_1$, $25_2$, ..., $25_N$ during the discharge. This is achieved by disconnecting a current source $25_1$, $25_2$, ..., $25_N$ when the trailing edge of the pulse crosses a predefined threshold, here, the energy threshold $X_1$, $X_2$, ..., $X_N$, associated with the current source $25_1$, $25_2$, ..., $25_N$. For instance, let us assume that the leading edge of the pulse has crossed all energy thresholds $X_1$, $X_2$, ..., $X_N$ such that all current sources $25_1$, $25_2$, ..., $25_N$ are initially connected in parallel to the integrator 19 to discharge the integrator 19. Now, during the discharge, the trailing edge of the pulse successively crosses the highest energy threshold $X_N$ and any lower energy thresholds up to the lowest energy threshold $X_1$, wherein, in each case, the current source $25_1$, $25_2$, ..., $25_N$ to which the respective energy threshold $X_1$, $X_2$, ..., $X_N$ is associated is disconnected.

As in the embodiment with the one current source 25 shown in FIG. 2, the discharge can be performed by each current source $25_1$, $25_2$, ..., $25_N$ with a constant current resulting in a piece-wise linear discharge, wherein the respective slope depends on the number of connected current sources $25_1$, $25_2$, ..., $25_N$. In this manner, the discharge of the integrator 19 can be made faster while the pulse is higher and slowed-down as the pulse becomes lower. Moreover, when the trailing edge of the pulse crosses the lowest energy threshold $X_1$ of the energy discriminator 29, the pulse shaper 18 disconnects the one remaining current source $25_1$ and reconnects the feedback resistor 22 in parallel to the integrator 19. As described, the remaining discharge then occurs according to the RC time constant of the feedback capacitor 21 and the feedback resistor 22. The benefit of such a topology is the deterministic slope between thresholds, which may further facilitate pile-up modeling. Furthermore, a "soft" transition as realized by the interaction of the N current sources $25_1$, $25_2$, ..., $25_N$ may help in minimizing spurious transients caused by a limited slew-rate of the operational amplifier 20.

The connecting and disconnecting of each current source $25_1$, $25_2$, ..., $25_N$ as well as of the feedback resistor 22 can be performed by means of corresponding switches that are foreseen in the paths of the feedback resistor 22 and the N current sources $25_1$, $25_2$, ..., $25_N$. In particular, the switch corresponding to the lowest energy threshold $X_1$ and the switch corresponding to the feedback resistor 22 can be driven by a same signal, wherein when one of the switches is closed the other switch is opened and vice versa.

Figure 4:
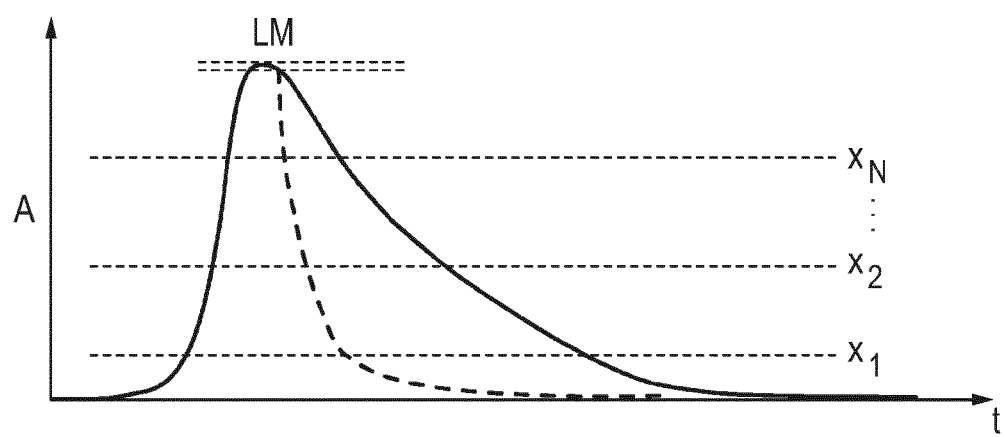
FIG. 4 shows schematically and exemplarily a graph illustrating the discharge of the integrator with N current sources.

FIG. 4 shows schematically and exemplarily a graph illustrating the discharge of the integrator with the N current sources $25_1$, $25_2$, ..., $25_N$. The abscissa of the graph shows the duration t of the pulse and the ordinate shows the amplitude A of the pulse. The peak of the pulse is detected, here, as the local maximum LM. Of course, if the pulse was negative, the peak may be detected as the local minimum. As can be seen from the graph, upon detection of the peak the discharge of the integrator 19 by the switchable discharge circuitry 23 is started. In this example, the peak of the pulse is assumed to be higher than the highest energy threshold $X_N$ such that all current sources $25_1, 25_2, \ldots, 25_N$ are initially connected in parallel to the integrator 19 to discharge the integrator 19. In this situation, the linear discharge occurs with a comparably steep slope resulting from the joint action of the N current sources $25_1, 25_2, \ldots, 25_N$. After the trailing edge of the pulse has crossed the highest energy threshold $X_N$, the current source $25_N$ is disconnected and the linear discharge occurs with a now reduced slope resulting from the joint action of the N−1 current sources $25_1, 25_2, \ldots$. Each time another energy threshold $X_1, X_2, \ldots$ is crossed by the trailing edge of the pulse another current source $25_1, 25_2, \ldots$ is disconnected resulting in a gradual reduction of the number of connected current sources $25_1, 25_2, \ldots, 25_N$ and a corresponding reduction of the slope of the linear discharge. Finally, when the trailing edge of the pulse crosses the lowest energy threshold $X_1$, the one remaining current source $25_1$ is disconnected and the feedback resistor 22 is reconnected in parallel to the integrator 19, wherefore the remaining discharge occurs according to the RC time constant of the feedback capacitor 21 and the feedback resistor 22.

Figure 5:
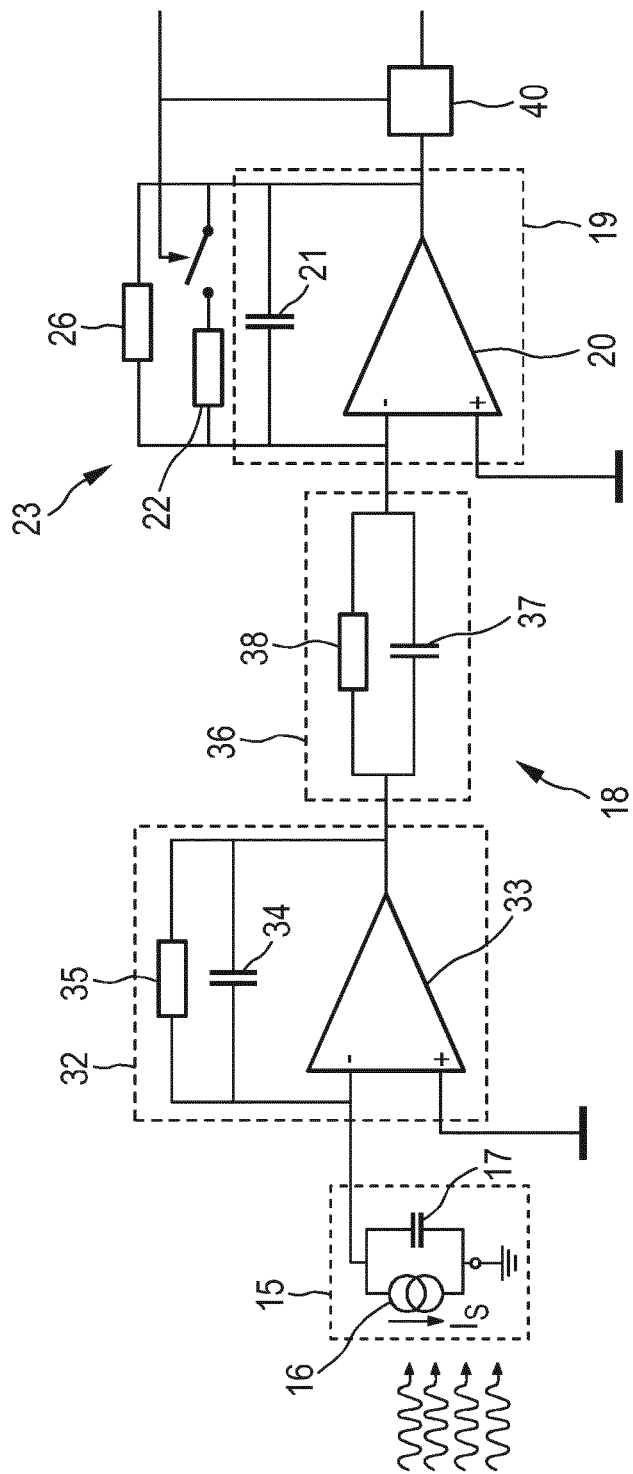
FIG. 5 shows schematically and exemplarily another embodiment of a detection element of the spectral photon counting detector shown in FIG. 1.

FIG. 5 shows schematically and exemplarily another embodiment of a detection element 3 of the spectral photon counting detector 6 shown in FIG. 1. In the figure, the right part of FIG. 2, which shows the peak detector 24, the energy discriminator 29, the photon counter 30 and the read-out 31, has been omitted. 12. The pulse shaper 18, here, further comprises a pre-amplifier 32 for amplifying the electrical signal that depends on the energy of the detected photon and a zero-pole canceller 36 for preventing an undershooting. The pre-amplifier 32 comprises an additional operational amplifier 33 and a combination of a feedback capacitor 34 and a feedback resistor 35 that are both connected in parallel to the operational amplifier 33. The zero-pole canceller 36 comprises a capacitor 37 and a resistor 38 connected in parallel.

In this embodiment, the pulse shaper 18 further comprises a charging phase start detector 40 for detecting the start of a charging phase of the integrator 19. Moreover, the switchable discharge circuitry 23 comprises the feedback resistor 22, wherein the pulse shaper 18 is adapted to disconnect the feedback resistor 22 from the integrator 19 between the detected start and the detection of the peak and to connect the feedback resistor 22 to discharge the integrator 19. Thus, the discharge of the integrator 19 is performed here by the feedback resistor 22, whereas in the embodiments shown in FIGS. 2 and 3 it was performed by the at least one current source 25 resp. $25_1, 25_2, \ldots, 25_N$. This embodiment aims at minimizing both the ballistic deficit and a potential (partial) charge loss during the discharge phase. The feedback resistor 22 is disconnected from the integrator 19 during the charging phase (charge collection phase) and reconnected again when the peak of the pulse is detected by the peak detector 24, i.e., when all the charge resulting from the impinging of a single photon on the radiation sensitive sensor 15 has been collected.

Preferentially, since the feedback resistor 22 is connected to the integrator 19 before the start of the charging phase is detected, any low-energy events which stay undetected by the charging phase start detector 40, such that the feedback resistor 22 is not disconnected, then see a "continuous reset" as implemented by the feedback resistor 22, i.e., the pulse shaper 18 generates a small pulse which is, however, not detected (since its amplitude is not sufficient to trigger the charging phase start detector 40), and the problem of a remaining energy pedestal is eliminated.

Here, the charging phase start detector 40 is adapted to detect the start of the charging phase by detecting a fast change of the amplitude of the pulse. This takes account of the fact that the amplitude of the pulse is expected to change quickly at the start of the charging phase. Since the two-stage topology (pulse shaper 18 plus the pre-amplifier 32 (and the zero-pole canceller 36)) shown in FIG. 5 generates pulses having a negative amplitude for an electron collecting sensor like CZT, the start of the charging phase is detected by a fast decrease of the output voltage of the operational amplifier 20. In a single-stage topology (no CSA, only a shaper), the output amplitude would be positive, and the start of charging phase would be detected by a fast increase of the output voltage of the operation amplifier 20. An embodiment of a suitable charging phase start detector 40 is schematically and exemplarily shown in FIG. 6. The charging phase start detector 40 comprises an inverter 41 and a comparator 42. The inverter 41 is adapted to delay the output signal of the integrator 19 and the comparator 42 generates a logical 1 if the "non delayed" output signal of the integrator 19 is by a voltage $V_H$ lower than the "delayed" signal, indicating a fast decrease of the output signal of the integrator 19. The comparator 42 stays at a logical 1 until the pulse reaches its peak, here, detected as the local minimum. In this embodiment, the logic level 1 is "latched" with a flip-flop. The charging phase start detector 40 is used to trigger the disconnecting of the feedback resistor 22 from the integrator 19 during the charging phase and the peak detector 24 is used to detect the peak of the pulse and, upon detection of the peak, trigger the reconnecting of the feedback resistor 22 in parallel to the integrator 19 and reset the charging phase start detector 40.

The feedback resistor 22 is preferably dimensioned to be relatively small in order to discharge the integrator 19 fast enough to support high count rates. While a small feedback resistor 22 causes a high ballistic deficit in a traditional implementation of the "continuous reset", this is no issue here due to the disconnecting the feedback resistor 22 during the charging phase (charge collection phase). If two x-ray photons impinge on the radiation sensitive sensor 15 shortly after each other, three cases are possible:

i) They are so close to each other that the minimum of the first pulse is not detected. In this case, both events are considered as a single event providing the total charge of both events.

ii) They are relatively close to each other, but the peak of the first pulse is detected such that the feedback resistor 22 is connected in parallel to the integrator 19 and the integrator 19 is discharged. Due to the second event, the output signal of the integrator 19 will again increase, which is detected by the charging phase start detector 40, which will lead to the feedback resistor 22 being again disconnected. In this case, for a short time, the second event "sees" the integrator 19 in parallel with the feedback resistor 22 so that a small ballistic deficit results.

iii) They have a time distance longer than the time it takes to discharge the integrator 19 with the feedback resistor 22 connected in parallel. In this case, the total charge of both events is collected and there is no ballistic deficit.

The advantage of this is that a count rate as high or higher as with a conventional "continuous reset" scheme may be achievable without suffering from ballistic deficit.

Figure 6:
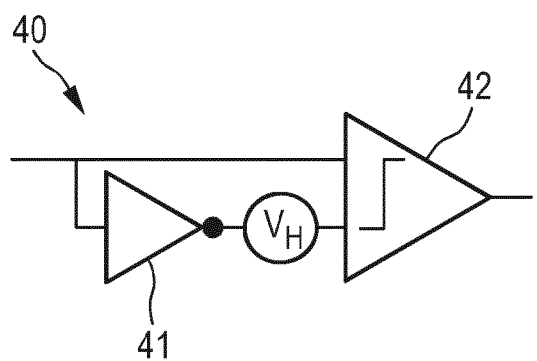
FIG. 6 shows schematically and exemplarily an embodiment of a charging phase start detector.

As further shown in FIG. 6, in this embodiment, the pulse shaper 18 further comprises an additional feedback resistor 26 that is permanently connected in parallel to the integrator

19. In particular, if the additional feedback resistor 26 is quite large, this can simplify the detection of the peak, here, the local minimum, of the pulse. This larger feedback resistor 26 makes sure that a real peak is formed, which can be detected more easily by the peak detector as shown in FIG. 2.

Figure 7:
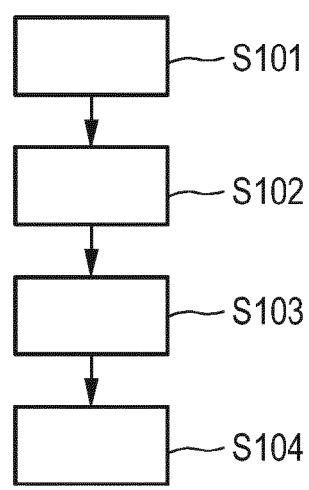
FIG. 7 shows a flowchart exemplarily illustrating an embodiment of a pulse shaping method.

FIG. 7 shows a flowchart exemplarily illustrating an embodiment of a pulse shaping method, which can be realized with any of the embodiments of the detection element 3 shown in FIGS. 2, 3 and 5.

In step S101, an integrator 19 generates a pulse having a peak amplitude indicative of the energy of a detected photon.

In step S102, a peak detector 24 detects the peak of the pulse.

In step S103, the discharge of the integrator 19 by the switchable discharge circuitry 23 is started based on the detection of the peak.

In step S104, a feedback resistor 22 is connected in parallel to the integrator 19 during a period of the pulse generation and the feedback resistor 22 is disconnected during another period of the pulse generation.

Although in the embodiments described with reference to FIGS. 3 and 4, the predefined thresholds correspond to the energy thresholds $X_1, X_2, \ldots, X_N$ of the energy discriminator 29, this does not necessarily have to be the case. For instance, in other embodiments, the number of current sources that are comprised by the switchable discharge circuitry 23 may be lower than the number of the energy thresholds $X_1, X_2, \ldots, X_N$ and only a subset thereof may be employed for controlling the connecting resp. disconnecting of the current sources. Also, all or some of the predefined thresholds may be defined independent of the energy thresholds $X_1, X_2, \ldots, X_N$ used for the energy discrimination.

Although in the embodiments described with reference to FIGS. 3 and 4, the pulse shaper 18 is adapted to stop the discharge of the integrator 19 by the switchable discharge circuitry 23 when the trailing edge of the pulse crosses the lowest energy threshold $X_1$ of the energy discriminator 29, this may be different in other embodiments. For instance, an additional threshold (not used for energy binning) between the lowest energy threshold $X_1$ and a baseline of the peak may be chosen as the predefined threshold. In this case, it is preferred that the additional threshold is as close as possible to the baseline of the pulse, such that the remaining charge stored in the integrator 19 can be small compared to the equivalent energy of the lowest threshold $X_1$ of the energy discriminator. As a further alternative, the baseline of the peak may be used as the predefined threshold, in which case the integrator 19 will be fully discharged by the switchable discharge circuitry 23. However, this might cause overshoots due to the finite reaction time between detecting the zero-crossing and releasing the reset.

In the embodiments described with reference to FIGS. 2 to 4, the pulse shaper 18 may further comprise a valley detector (not shown in the figures) for detecting a valley between two pulses, wherein the pulse shaper 18 could be adapted to stop the discharge by the switchable discharge circuitry 23 based on the detection of the valley. This could be implemented by means of a modified peak detector which instead of detecting local maxima, would be designed to detect the valley between two pulses. The benefit of doing so would be to ensure that the discharging mechanism does not affect the start of the pulse generated by the pulse shaper 18 when x-ray photons impinge on the radiation sensitive sensor 15 during the discharge of the integrator 19. Such a modified peak detector could be based on the same topology as shown in FIG. 2 with an inverting buffer stage at the input. The valley detector may allow to timely stop the discharge by the switchable discharge circuitry 23 in the event of a pulse impinging on the radiation sensitive sensor 15 overlapped to the discharge of a preceding pulse. In that event it would be important to stop the discharge and to allow collecting the charge of the new event. In the absence of pile-up, however, the peak detector would need to be combined with one of the described threshold-based mechanisms for stopping the discharge by the switchable discharge circuitry 23 to ensure that the discharge is also stopped in such conditions.

In an alternative to the embodiment described with reference to FIGS. 5 and 6, it is foreseen that the charging phase start detector 40 is good enough to determine that the minimum of the pulse is reached, since in this situation the output signal of the integrator 19 no longer changes, in which case the output of the comparator 42 goes back to 0. If this is the case, the peak detector 24 can be dispensed with and the connecting of the feedback resistor 22 can be triggered directly by the charging phase start detector 40. However, this implies that a certain amount of ballistic deficit is still acceptable.

It shall be noted that in the embodiment described with reference to FIGS. 5 and 6, there is no need for a specific mechanism for stopping the discharge by the switchable discharge circuitry 23. Rather the discharge is inherently "self"-stopped when the feedback resistor 22 has completely depleted the charge from the feedback capacitor 21. In other words: Once the peak (here, a local minimum) has been detected and the switchable discharge circuitry 23 has been triggered to reconnect the feedback resistor 22, the discharge works in the same manner as a "continuous reset" configuration.

Other variations to the disclosed embodiments can be understood and effected by those skilled in the art in practicing the claimed invention, from a study of the drawings, the disclosure, and the appended claims.

In the claims, the word "comprising" does not exclude other elements or steps, and the indefinite article "a" or "an" does not exclude a plurality.

A single unit or device may fulfill the functions of several items recited in the claims. The mere fact that certain measures are recited in mutually different dependent claims does not indicate that a combination of these measures cannot be used to advantage.

Operations like the detection of the peak of the pulse, the control of the discharge of the integrator 19 by the switchable discharge circuitry 23, et cetera performed by one or several units or devices can be performed by any other number of units or devices. These operations can be partly implemented as program code means of a computer program and/or as dedicated hardware.

A computer program may be stored/distributed on a suitable medium, such as an optical storage medium or a solid-state medium, supplied together with or as part of other hardware, but may also be distributed in other forms, such as via the Internet or other wired or wireless telecommunication systems.

Any reference signs in the claims should not be construed as limiting the scope.

The invention relates to a pulse shaper. The pulse shaper comprises an integrator for generating a pulse having a peak amplitude indicative of the energy of a detected photon, a feedback resistor, switchable discharge circuitry for discharging the integrator, and a peak detector for detecting the peak of the pulse. The pulse shaper is adapted to start the discharge of the integrator by the switchable discharge circuitry based on the detection of the peak and to connect the feedback resistor in parallel to the integrator during a period of the pulse generation and to disconnect the feedback resistor during another period of the pulse generation.

The invention claimed is:

1. A pulse shaper for use in a spectral photon counting detector, comprising:
   an integrator configured to generate a pulse having a peak amplitude indicative of the energy of a detected photon;
   a feedback resistor;
   switchable discharge circuitry configured to discharge the integrator; and
   a peak detector configured to detect the peak of the pulse,
   wherein the pulse shaper is configured to start the discharge of the integrator by the switchable discharge circuitry based on the detection of the peak, connect the feedback resistor in parallel to the integrator during a period of the pulse generation and disconnect the feedback resistor during another period of the pulse generation;
   wherein the switchable discharge circuitry comprises at least one current source, and wherein the pulse shaper is configured to connect the at least one current source in parallel to the integrator to discharge the integrator and disconnect the feedback resistor from the integrator during the discharge.

2. The pulse shaper as defined in claim 1, wherein the at least one current source comprises two or more current sources, wherein the number of the current sources that are connected depends on a number of predefined thresholds associated with the two or more current sources that are crossed by the leading edge of the pulse.

3. The pulse shaper as defined in claim 1, wherein the at least one current source comprises two or more current sources, wherein the pulse shaper is configured to gradually reduce the number of connected current sources during the discharge.

4. The pulse shaper as defined in claim 3, wherein the pulse shaper is configured to disconnect a current source when the trailing edge of the pulse crosses a predefined threshold associated with the current source.

5. The pulse shaper as defined in claim 1, wherein the pulse shaper is configured to stop the discharge by the switchable discharge circuitry when the trailing edge of the pulse crosses a predefined threshold.

6. The pulse shaper as defined in claim 5, wherein the spectral photon counting detector comprises an energy discriminator for comparing the peak amplitude to one or more energy thresholds, wherein the predefined threshold is selected from the lowest energy threshold of the energy discriminator, an additional threshold between the lowest energy threshold of the energy discriminator and a baseline of the peak, and the baseline of the peak.

7. The pulse shaper as defined in claim 1, further comprising a valley detector configured to detect a valley between two pulses, wherein the pulse shaper is configured to stop the discharge by the switchable discharge circuitry based on the detection of the valley.

8. The pulse shaper as defined in claim 1, further comprising a pre-amplifier configured to amplify an electrical signal that depends on the energy of the detected photon, wherein the amplifier is arranged upstream to the integrator, and the pulse shaper is configured to perform the detection of the peak and the control of the discharge by the switchable discharge circuitry based on the amplified electrical signal.

9. A pulse shaper for use in a spectral photon counting detector, comprising:
   an integrator configured to generate a pulse having a peak amplitude indicative of the energy of a detected photon;
   a feedback resistor;
   switchable discharge circuitry configured to discharge the integrator; and
   a peak detector configured to detect the peak of the pulse,
   wherein the pulse shaper is configured to start the discharge of the integrator by the switchable discharge circuitry based on the detection of the peak and to connect the feedback resistor in parallel to the integrator during a period of the pulse generation and to disconnect the feedback resistor during another period of the pulse generation;
   wherein the pulse shaper further comprises a charging phase start detector for detecting the start of a charging phase of the integrator, wherein the switchable discharge circuitry comprises the feedback resistor, and wherein the pulse shaper is configured to disconnect the feedback resistor from the integrator between the detected start and the detection of the peak and to connect the feedback resistor to discharge the integrator.

10. The pulse shaper as defined in claim 9, wherein the charging phase start detector is configured to detect the start by detecting a fast change of the amplitude of the pulse.

11. The pulse shaper as defined in claim 9, further comprising an additional feedback resistor that is permanently connected in parallel to the integrator.

12. A spectral photon counting detector, comprising:
    detection elements for detecting polyenergetic x-ray radiation, wherein each detection element comprises:
       a radiation sensitive sensor;
       a pulse shaper comprising:
          an integrator configured to generate a pulse having a peak amplitude indicative of the energy of a detected photon;
          a feedback resistor;
          switchable discharge circuitry configured to discharge the integrator; and
          a peak detector configured to detect the peak of the pulse,
          wherein the pulse shaper is configured to start the discharge of the integrator by the switchable discharge circuitry based on the detection of the peak, connect the feedback resistor in parallel to the integrator during a period of the pulse generation and disconnect the feedback resistor during another period of the pulse generation;
          wherein the switchable discharge circuitry comprises at least one current source, and wherein the pulse shape is configured to connect the at least one current source in parallel to the integrator to discharge the integrator and disconnect the feedback resistor from the integrator during the discharge;
       an energy discriminator configured to compare the peak amplitude to one or more energy thresholds; and
       a photon counter configured to count for each energy threshold the number of times the leading edge of a pulse crosses the energy threshold.

13. An x-ray imaging system, comprising:
    an x-ray radiation device for providing polyenergetic x-ray radiation for traversing an examination zone adapted to accommodate an object;

a spectral photon counting detector comprising:
  detection elements for detecting polyenergetic x-ray radiation, wherein each detection element comprises:
    a radiation sensitive sensor;
    a pulse shaper comprising:
      an integrator configured to generate a pulse having a peak amplitude indicative of the energy of a detected photon;
      a feedback resistor;
      switchable discharge circuitry configured to discharge the integrator; and
      a peak detector configured to detect the peak of the pulse;
      wherein the pulse shaper is configured to start the discharge of the integrator by the switchable discharge circuitry based on the detection of the peak, connect the feedback resistor in parallel to the integrator during a period of the pulse generation and disconnect the feedback resistor during another period of the pulse generation;
      wherein the switchable discharge circuitry comprises at least one current source, and wherein the pulse shape is configured to connect the at least one current source in parallel to the integrator to discharge the integrator and disconnect the feedback resistor from the integrator during the discharge;
    an energy discriminator configured to compare the peak amplitude to one or more energy thresholds; and
    a photon counter configured to count for each energy threshold the number of times the leading edge of a pulse crosses the energy threshold; and
  a reconstruction unit for reconstructing an image based on the photon counts.

14. A pulse shaping method for use in a spectral photon counting detector, comprising:
  generating a pulse having a peak amplitude indicative of the energy of a detected photon;
  detecting the peak of the pulse;
  starting a discharge of an integrator by a switchable discharge circuitry based on the detection of the peak; and
  connecting a feedback resistor in parallel to the integrator during a period of the pulse generation and disconnecting the feedback resistor during another period of the pulse generation;
  wherein the switchable discharge circuitry comprises at least one current source, wherein the at least one current source in parallel to the integrator is configured to discharge the integrator and disconnect the feedback resistor from the integrator during the discharge.

15. A pulse shaping method for use in a spectral photon counting detector, comprising:
  generating a pulse having a peak amplitude indicative of the energy of a detected photon;
  detecting the peak of the pulse;
  starting a discharge of an integrator by a switchable discharge circuitry based on the detection of the peak;
  connecting a feedback resistor in parallel to the integrator during a period of the pulse generation and disconnecting the feedback resistor during another period of the pulse generation; and
  detecting the start of a charging phase of the integrator by a charging phase start detector, wherein the switchable discharge circuitry comprises the feedback resistor, wherein the feedback resistor is configured to disconnect from the integrator between the detected start and the detection of the peak and connect the feedback resistor to discharge the integrator.

* * * * *